(12) United States Patent
Goel et al.

(10) Patent No.: US 11,747,040 B2
(45) Date of Patent: *Sep. 5, 2023

(54) DETERMINATION OF BLOWER FLOW RATE

(71) Applicant: Lennox Industries Inc., Richardson, TX (US)

(72) Inventors: Rakesh Goel, Irving, TX (US); Shiliang Wang, Dallas, TX (US)

(73) Assignee: Lennox Industries Inc., Richardson, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/047,469

(22) Filed: Oct. 18, 2022

(65) Prior Publication Data

US 2023/0057400 A1    Feb. 23, 2023

Related U.S. Application Data

(63) Continuation of application No. 16/885,661, filed on May 28, 2020, now Pat. No. 11,519,629.

(51) Int. Cl.
*F24F 11/67* (2018.01)
*G01R 31/34* (2020.01)
*G01F 9/00* (2006.01)

(52) U.S. Cl.
CPC .............. *F24F 11/67* (2018.01); *G01F 9/001* (2013.01); *G01R 31/343* (2013.01)

(58) Field of Classification Search
CPC .. F24F 11/67; F24F 11/39; F24F 11/30; F24F 11/77; G01F 9/001; G01R 31/343; Y02B 30/70
See application file for complete search history.

(56) References Cited

U.S. PATENT DOCUMENTS

| | | | |
|---|---|---|---|
| 11,150,162 B1 * | 10/2021 | Wang | F24F 11/63 |
| 11,519,629 B2 * | 12/2022 | Goel | F24F 11/30 |
| 2013/0087319 A1 * | 4/2013 | Havard | F24F 11/77 |
| | | | 29/890.03 |
| 2018/0356124 A1 * | 12/2018 | Gupte | F24F 3/044 |
| 2020/0340553 A1 * | 10/2020 | Salunkhe | F16H 7/1281 |

* cited by examiner

*Primary Examiner* — Christopher P McAndrew
*Assistant Examiner* — Zannatul Ferdous
(74) *Attorney, Agent, or Firm* — Baker Botts L.L.P.

(57) ABSTRACT

An HVAC system includes a blower, a motor drive, and a controller. A benchmark rate of the flow of air provided by the blower and a corresponding benchmark power output of the motor drive associated with operation of the blower at a test condition are received. The controller determines a first motor drive frequency at which the motor drive is operating. Based on the benchmark rate and a comparison of the first motor drive frequency to the predefined motor drive frequency, a first rate of the flow of air provided by the blower is determined. At a later time, a current power output of the motor drive is determined during operation of the blower at the test condition. Based on a comparison of the current benchmark power output to the benchmark power output, an updated benchmark rate of the flow of air provided by the blower is determined.

20 Claims, 5 Drawing Sheets

DETERMINATION OF BLOWER FLOW RATE

CROSS-REFERENCE TO RELATED APPLICATIONS

This application is a continuation of U.S. patent application Ser. No. 16/885,661 filed May 28, 2020, by Rakesh Goel et al., entitled "DETERMINATION OF BLOWER FLOW RATE," which is incorporated herein by reference.

TECHNICAL FIELD

The present disclosure relates generally to heating, ventilation, and air conditioning (HVAC) systems and methods of their use. In certain embodiments, the present disclosure relates to determination of blower flow rate.

BACKGROUND

Heating, ventilation, and air conditioning (HVAC) systems are used to regulate environmental conditions within an enclosed space. A blower of the HVAC system provides a flow of air through the HVAC system. In cooling mode operation of the HVAC system, the flow of air may be cooled via heat transfer with refrigerant and returned to the enclosed space as cooled conditioned air. In heating mode operation of the HVAC system, the flow of air may be heated via heat transfer with a heating element and returned to the enclosed space as heated conditioned air.

SUMMARY OF THE DISCLOSURE

In an embodiment, a heating, ventilation and air conditioning (HVAC) system includes a blower. The blower incudes a pulley configured, when rotated, to cause a flow of air to be provided through at least one duct of the HVAC system. The blower includes a motor configured, when supplied electrical power, to cause the pulley to rotate. A motor drive provides the electrical power to the motor of the blower. A controller is communicatively coupled to the motor drive. A benchmark rate of the flow of air provided by the blower and a corresponding benchmark power output of the motor drive associated with operation of the blower at a test condition are received by the controller. The test condition corresponds to operating the blower at a predefined motor drive frequency. During operation of the HVAC system for an initial period of time, the controller determines that the motor drive is operating at a first motor drive frequency. The first motor drive frequency is different than the predefined motor drive frequency of the test conditions. The controller determine, based on the benchmark rate of the flow of air provided by the blower and a comparison (e.g., a ratio) of the first motor drive frequency to the predefined motor drive frequency, a first rate of the flow of air provided by the blower. Following operation of HVAC system for the initial period of time, the controller determines a current power output of the motor drive during operation of the blower at the test condition. The current power output is less than the benchmark power output. The controller determines, based on the benchmark rate of the flow of air provided by the blower and a comparison (e.g., a ratio) of the current benchmark power output to the benchmark power output, an updated benchmark rate of the flow of air provided by the blower. The controller determines that the motor drive is operating at a second motor drive frequency. Based on the updated benchmark rate of the flow of air provided by the blower and a comparison (e.g., a ratio) of the second motor drive frequency to the predefined motor drive frequency, a second rate is determined of the flow of air provided by the blower.

The rate of airflow through an HVAC system may change over time because of changes in airflow resistance. Airflow resistance might change because of a buildup of material on a filter of the system (e.g., the buildup of dust on the filter), a blockage of a duct of the HVAC system, changes to the duct design (e.g., adding/removing ductwork, otherwise changing flow profile through system (e.g., opening/closing vents, etc.), and the like. If the rate of airflow through an HVAC system is below a threshold value for a period of time, an evaporator coil of the HVAC system may freeze resulting in extended downtimes of the HVAC system for maintenance. Previous technology lacks the ability to reliably monitor the rate of airflow provided by a blower and to detect when the rate of the airflow provided by the blower unexpectedly changes. Previously, a decrease in the rate of airflow would typically go undetected until a user recognized the loss of expected air flow rate. Belt-drive blowers, which are used in many common HVAC systems do not provide information about the rate of airflow provided, and sensors to measure rates of airflow are costly and unreliable. As such, previous systems commonly lacked measurements of the rate of airflow provided by blowers.

This disclosure solves problems of previous technology, including those described above, by facilitating the improved determination of air flow rates without relying on measurements from air flow rate sensors. When a loss of air flow rate is detected sooner, as is facilitated by the present disclosure, damage and associated costs and system downtimes can be avoided. This disclosure may facilitate the provision of an alert when a predetermined amount of loss of air flow rate is detected. This alert may facilitate the initiation of corrective measures before damage to the HVAC system and/or extended downtimes. For example, in some cases, the alert may prompt a user to change an air filter of the HVAC system. If upon changing the air filter, the loss of air flow rate is still detected, further maintenance may be indicated. As another example, a fault associated with a significant loss of airflow can be detected and operation of the HVAC system may be automatically halted to prevent damage to system components.

The HVAC system described in this disclosure may have improved performance compared to previous systems because other system parameters (e.g., compressor speeds) can be adjusted to preferred values based on the more accurate air flow rate measurements. For instance, compressor speed may be adjusted to obtain a desired ratio of flow rate per tonnage of cooling (e.g., a predetermined CFM/ton ratio) based on a more accurate air flow rate measurement. The HVAC system controller described in this disclosure may adjust power supplied to a blower to achieve a desired rate of air flow, even when air flow resistance in the system changes over time (e.g., due to dust buildup on an air filter). The systems and methods described in this disclosure may be integrated into a practical application for providing reliable air flow rate measurements and improving the performance of an HVAC systems which includes a belt-drive blower but lacks any sensor(s) for directly measuring the rotation rate of the blower and/or the rate of air flow provided by the blower.

Certain embodiments may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present disclosure, reference is now made to the following description, taken in conjunction with the accompanying drawings, in which.

DETAILED DESCRIPTION

Embodiments of the present disclosure and its advantages are best understood by referring to FIGS. 1 through 6 of the drawings, like numerals being used for like and corresponding parts of the various drawings.

As described above, prior to the present disclosure, there was a lack of tools for determining rate of airflow provided by a blower. For example, previous technology lacks tools for determining the rate of airflow provided by a blower. The HVAC system controller described in this disclosure solves these problems of previous technology by detecting such changes in air flow rate based, for example, on changes in the power output of a blower motor drive under predefined test conditions. The controller may use this information to appropriately adjust system operation (e.g., to achieve a desired rate of airflow or to achieve a desired CFM/ton ratio) and/or to prompt users to perform corrective actions such as changing an air filter of the HVAC system.

HVAC System

Figure 1:
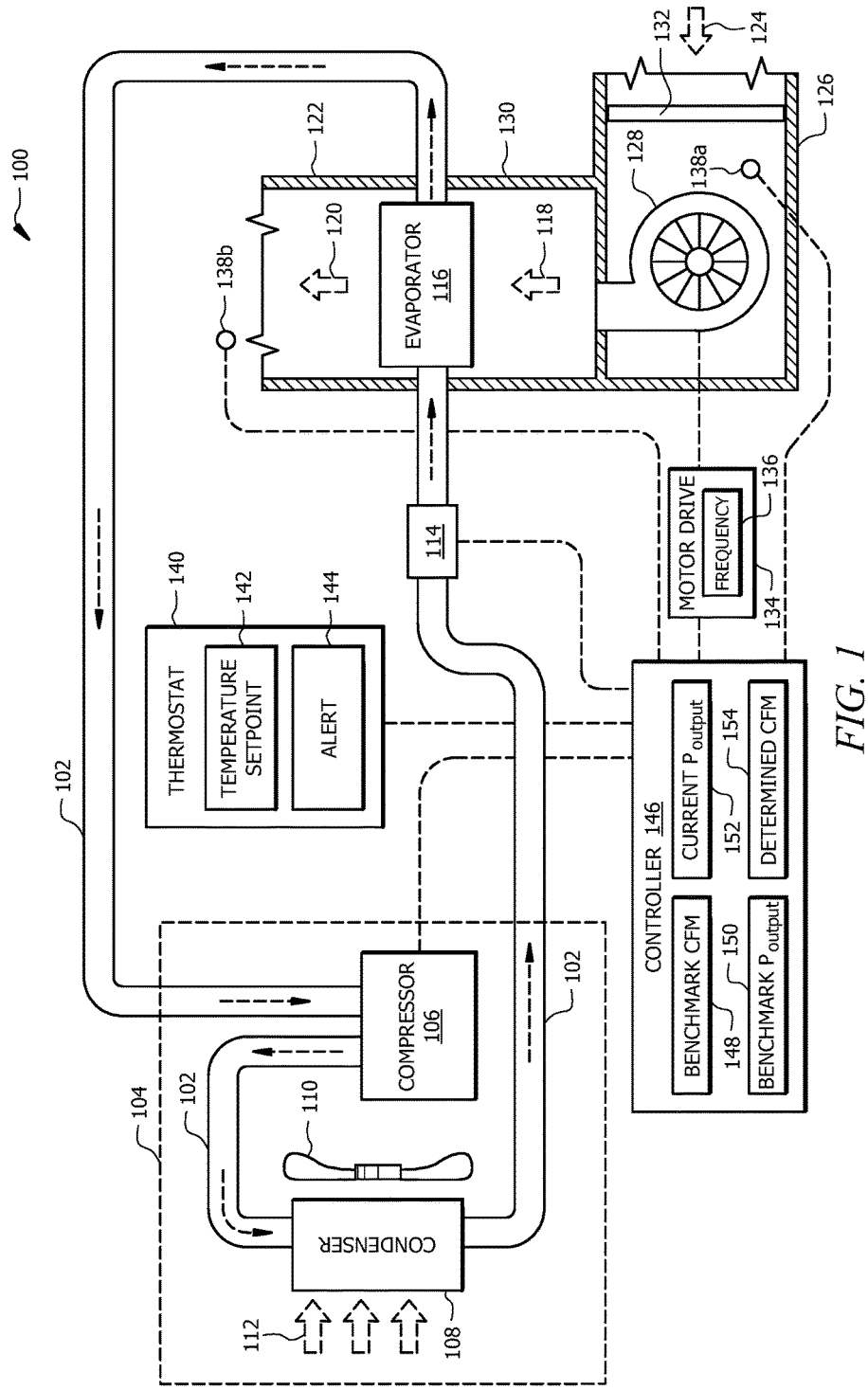
FIG. 1 is a diagram of an example HVAC system configured for the determination of the rate of airflow provided by a blower of the HVAC system.

FIG. 1 is a schematic diagram of an embodiment of an HVAC system 100 with a controller 146 configured to determine a rate 154 (e.g., in cubic feet per minute (CFM)) of the airflow 118 provided by the blower 128 of the system 100. The HVAC system 100 conditions air for delivery to a conditioned space. The conditioned space may be, for example, a room, a house, an office building, a warehouse, or the like. In some embodiments, the HVAC system 100 is a rooftop unit (RTU) that is positioned on the roof of a building and the conditioned air is delivered to the interior of the building. In other embodiments, portion(s) of the system 100 may be located within the building and portion(s) outside the building. The HVAC system 100 may include one or more heating elements, not shown for convenience and clarity. The HVAC system 100 may be configured as shown in FIG. 1 or in any other suitable configuration. For example, the HVAC system 100 may include additional components or may omit one or more components shown in FIG. 1.

The HVAC system 100 includes a working-fluid conduit subsystem 102, at least one condensing unit 104, an expansion valve 114, an evaporator 116, a blower 128 with a corresponding motor drive 134, a thermostat 140, and a controller 146. The working-fluid conduit subsystem 102 facilitates the movement of a working fluid (e.g., a refrigerant) through a cooling cycle such that the working fluid flows as illustrated by the dashed arrows in FIG. 1. The working fluid may be any acceptable working fluid including, but not limited to hydroflurocarbons (e.g. R-410A) or any other suitable type of refrigerant.

The condensing unit 104 includes a compressor 106, a condenser 108, and a fan 110. In some embodiments, the condensing unit 104 is an outdoor unit while other components of system 100 may be located indoors. The compressor 106 is coupled to the working-fluid conduit subsystem 102 and compresses (i.e., increases the pressure of) the working fluid. The compressor 106 of condensing unit 104 may be a single-stage compressor, a variable-speed compressor, or a multi-stage compressor. A variable-speed compressor is generally configured to operate at different speeds to increase the pressure of the working fluid to keep the working fluid moving along the working-fluid conduit subsystem 102. If compressor 106 is a variable-speed compressor, the speed of the compressor 106 can be modified to adjust the cooling capacity of the HVAC system 100. In the multi-stage compressor configuration, one or more compressors can be turned on or off to adjust the cooling capacity of the HVAC system 100.

The compressor 106 is in signal communication with the controller 146 using wired and/or wireless connection. The controller 146 provides commands and/or signals to control operation of the compressor 106 and/or receives signals from the compressor 106 corresponding to a status of the compressor 106. For example, when the compressor 106 is a variable-speed compressor, the controller 146 may provide signals to control compressor speed. When the compressor 106 operates as a multi-stage compressor, the signals may correspond to an indication of which compressors to turn on and off to adjust the compressor 106 for a given cooling capacity. The controller 146 may operate the compressor 106 in different modes corresponding to load conditions (e.g., the amount of cooling or heating requested from the HVAC system 100). The controller 146 is described in greater detail below and with respect to FIG. 6.

The condenser 108 is configured to facilitate movement of the working fluid through the working-fluid conduit subsystem 102. The condenser 108 is generally located downstream of the compressor 106 and is configured to remove heat from the working fluid. The fan 110 is configured to move air 112 across the condenser 108. For example, the fan 110 may be configured to blow outside air through the condenser 108 to help cool the working fluid flowing therethrough. The fan 110 may be in communication with the controller 146 (e.g., via wired and/or wireless communication) to receive control signals for turning the fan 110 on and off and/or adjusting a speed of the fan 110. The compressed, cooled working fluid flows from the condenser 108 toward an expansion device 114.

The expansion device 114 is coupled to the working-fluid conduit subsystem 102 downstream of the condenser 108 and is configured to remove pressure from the working fluid. In this way, the working fluid is delivered to the evaporator 116 and receives heat from airflow 118 to produce a conditioned airflow 120 that is delivered by a duct subsystem 122 to the conditioned space. In general, the expansion device 114 may be a valve such as an expansion valve or a flow control valve (e.g., a thermostatic expansion valve (TXV)) or any other suitable valve for removing pressure from the working fluid while, optionally, providing control of the rate of flow of the working fluid. The expansion device 114 may be in communication with the controller 146 (e.g., via wired and/or wireless communication) to receive control signals for opening and/or closing associated valves and/or to provide flow measurement signals corresponding to the rate of working fluid flow through the working-fluid conduit subsystem 102.

The evaporator 116 is generally any heat exchanger configured to provide heat transfer between air flowing through (or across) the evaporator 116 (i.e., air of airflow 118 contacting an outer surface of one or more coils of the evaporator 116) and working fluid passing through the interior of the evaporator 116. The evaporator 116 may include one or more circuits of coils. The evaporator 116 is fluidically connected to the compressor 106, such that working fluid generally flows from the evaporator 116 to the condensing unit 104 when the HVAC system 100 is operated in a cooling mode. As described above, when the rate of the airflow 118 falls below a threshold value, a coil of the evaporator 116 may freeze resulting to periods of downtime while the evaporator 116 is repaired or replaced. Knowledge of the rate 154 of the airflow 118 may facilitate the prevention of coil freezing. A portion of the HVAC system 100 is configured to move airflow 118 provided by the blower 128 across the evaporator 116 and out of the duct sub-system 122 as conditioned airflow 120. Return air 124, which may be air returning from the building, fresh air from outside, or some combination, is pulled into a return duct 126. An air filter 132 may be located within the return duct 126 to remove particulates from the return air 124.

A suction side of the blower 128 pulls the return air 124. The blower 128 discharges airflow 118 into a duct 130 such that airflow 118 crosses the evaporator 116 or heating elements (not shown) to produce conditioned airflow 120. The blower 128 is any mechanism for providing airflow 118 through the HVAC system 100. For example, the blower 128 may be a constant-speed or variable-speed circulation blower or fan. Examples of a variable-speed blower include, but are not limited to, belt-drive blowers controlled by inverters, direct-drive blowers with electronic commuted motors (ECM), or any other suitable type of blower.

A motor drive 134 supplies electrical power to the blower 128 based on instructions received from the controller 146. The motor drive 134 generally converts a signal (e.g., provided by the controller 146) into an appropriate output (e.g., with a corresponding motor drive frequency 136) for actuating the blower 128 (i.e., to power a motor of the blower 128). For example, the motor drive 134 may convert a sinusoidal input provided by the controller 146 into a set of voltage pulses with an appropriate frequency 136 for driving rotation of a motor of the blower 128. The motor drive 134 may be a variable frequency motor drive. For example, the motor drive 134 may control a speed of a motor of the blower 128 (see FIG. 2 and corresponding description below) by adjusting the input frequency 136 associated with power supplied to the motor of the blower 128. The motor drive 134 is in signal communication with the controller 146 and the blower 128 using any suitable type of wired and/or wireless connection. The controller 146 is configured to provide commands and/or signals to the motor drive 134 to control its operation (i.e., to control frequency 136 associated with electrical power supplied to the blower 128).

Figure 2:
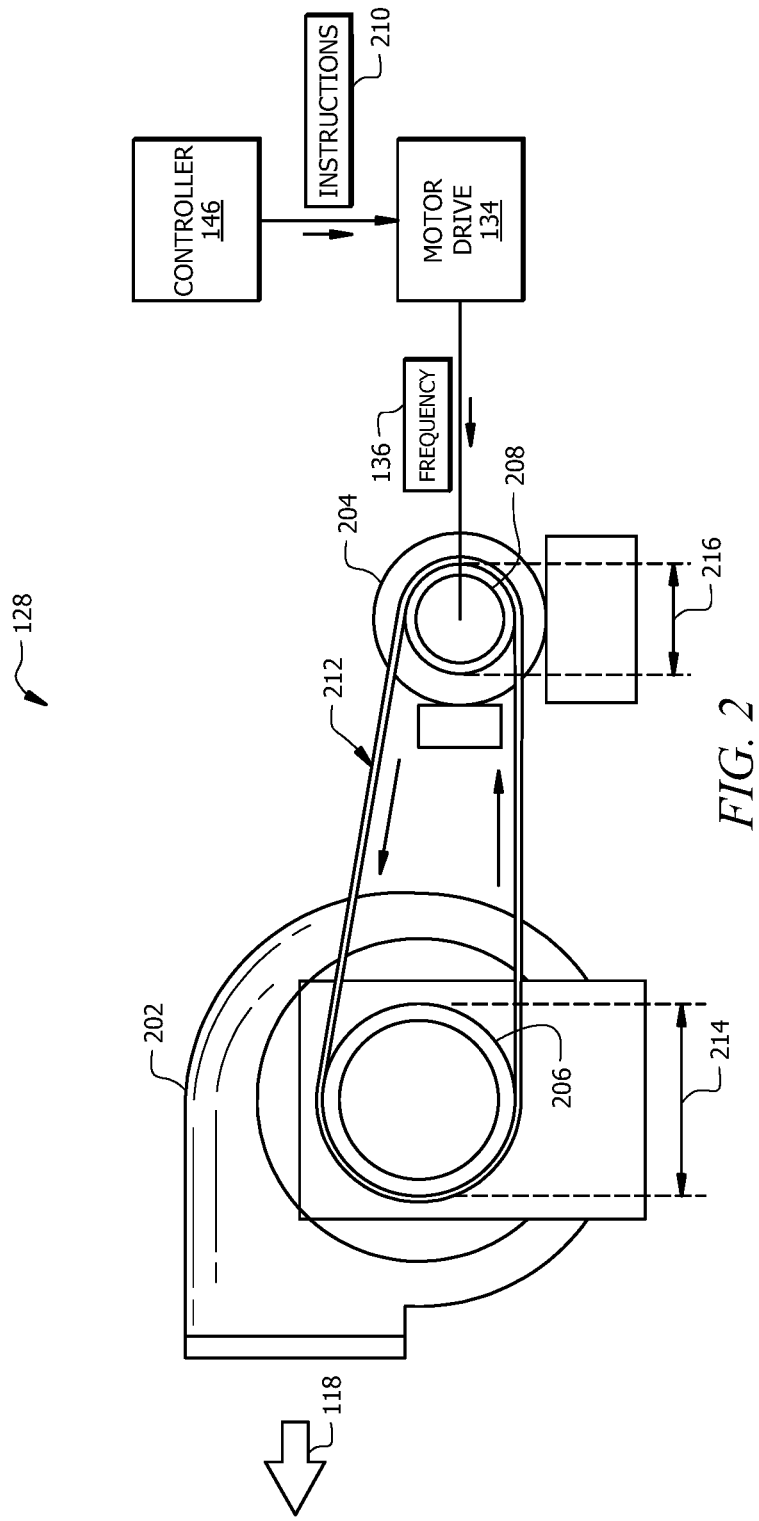
FIG. 2 is a diagram of an example blower and motor drive of the HVAC system illustrated in FIG. 1.

FIG. 2 illustrates an example of the blower 128 of FIG. 1 when the blower 128 is a belt-drive blower. As described above, previous technology lacked the ability to determine the rate of airflow 118 provided by a belt-drive blower without additional sensors for measuring a rotation rate of the blower 128 itself (e.g., rotation rate of a driven pulley 206 and/or of an impeller coupled thereto) and/or the rate of the airflow 118 itself (e.g., using an air flow sensor). Such sensors can be costly, difficult to maintain, and unreliable.

The example belt-drive blower 128 includes a main blower component 202 and a motor 204. The blower component 202 generally includes one or more rotatable impellers (e.g., or fan blades) which rotate based on movement of a driven pulley 206 to which the impeller(s) are coupled. The motor 204 includes a driver pulley 208 which rotates based on properties of the electrical power (e.g., the motor drive frequency 136) supplied by the motor drive 134. A belt 212 couples the driver pulley 208 to the driven pulley 206 of the blower component 202, such that when the driver pulley 208 of the motor 204 rotates (i.e., when the motor 204 is powered), the driven pulley 206 of the blower component 202 also rotates. This results in rotation of the impeller coupled to the driven pulley 206 and provision of the airflow 118 illustrated in FIG. 1. Properties of the motor drive frequency 136 are generally based on instructions 210 provided by the controller 146. The instructions 210 may include the frequency 136 at which to operate the motor drive 134.

The rate at which driven pulley 206 rotates compared to that at which the driver pulley 208 rotates is determined by a pulley ratio, which is the ratio of the diameter 214 of the driven pulley 206 to the diameter 216 of the driver pulley 208. During installation and setup of the HVAC system 100, it is common for the diameter 216 of the driver pulley 208 to be adjusted, such that the value of diameter 216 and the corresponding pulley ratio (i.e. diameter 214/diameter 216) are not known. Because the pulley ratio is unknown, the rate at which the driven pulley 206 is rotated and the resulting rate of airflow 118 provided by the blower 128 cannot be determined using previous technology. As described elsewhere herein, this disclosure facilitates the determination of the rate 154 of the airflow 118 provided by the blower 128. This rate 154 can be determined without using any additional sensor(s) to measure the rate at which the pulley 206 rotates or the rate 154 of the airflow 118 provided by the blower 128 (see also FIG. 1).

Returning to FIG. 1, the HVAC system 100 includes one or more sensors 138a,b in signal communication with controller 146 (e.g., via wired and/or wireless connection). Sensors 138a,b may include any suitable type of sensors for measuring air temperature, relative humidity, and/or any other properties of a conditioned space (e.g. a room or building). The sensors 138a,b may be positioned anywhere within the conditioned space, the HVAC system 100, and/or the surrounding environment. For example, as shown in the illustrative example of FIG. 1, the HVAC system 100 may include a sensor 138a positioned and configured to measure a return air temperature (e.g., of airflow 124) and/or a sensor 138b positioned and configured to measure a supply or treated air temperature (e.g., of airflow 120), a temperature of the conditioned space, and/or a relative humidity of the conditioned space. In other examples, the HVAC system 100 may include sensors positioned and configured to measure any other suitable type of air temperature (e.g., the temperature of air at one or more locations within the conditioned space and/or an outdoor air temperature) or other property (e.g., a relative humidity of air at one or more locations within the conditioned space).

The HVAC system 100 includes one or more thermostats 140, for example, located within the conditioned space (e.g. a room or building). A thermostat 140 is generally in signal communication with the controller 146 using any suitable type of wired and/or wireless connection. Also or alternatively, one or more functions of the controller 146 may be performed by the thermostat 140. For example, the thermostat 140 may include the controller 146. The thermostat 140 may be a single-stage thermostat, a multi-stage thermostat, or any suitable type of thermostat. The thermostat 140 is configured to allow a user to input a desired temperature or temperature setpoint 142 for the conditioned space and/or for a designated space or zone such as a room in the conditioned space. The controller 146 may use information from the thermostat 140 such as the temperature setpoint 142 for controlling the compressor 106, the motor drive 134, and/or the blower 128.

In some embodiments, the thermostat 140 includes a user interface and display for displaying information related to the operation and/or status of the HVAC system 100. For example, the user interface may display operational, diagnostic, and/or status messages and provide a visual interface that allows at least one of an installer, a user, a support entity, and a service provider to perform actions with respect to the HVAC system 100. For example, the user interface may provide for display of one or more alerts 144 (e.g., associated with a determination that a rate 154 of the airflow 118 has fallen below a threshold value associated with normal operation of the HVAC system 100) and/or messages related to the status and/or operation of the HVAC system 100. For example, an alert 144 may prompt a user to change the air filter 132 of the HVAC system 100. If the air filter 132 was recently replaced and the alert 144 is still being presented, the user may provide an indication of this and further diagnostics and/or maintenance may be warranted.

Figure 3:
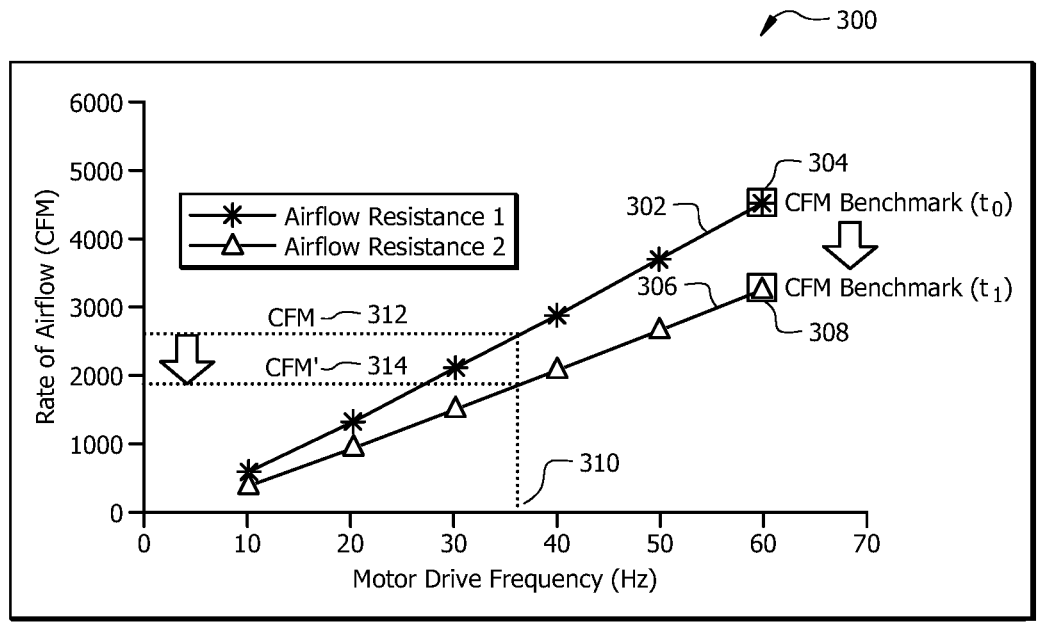
FIG. 3 is a plot of blower air flow rate versus motor drive frequency with different airflow resistances.

As described in greater detail below, the controller 146 is configured to receive a benchmark rate of airflow 148, which is provided by the blower under predetermined test conditions (e.g., at a predefined motor drive frequency 136 of the motor drive 134 and/or rate of airflow 118 or 120 when the blower 128 is installed). The controller 146 also receives a corresponding benchmark power output 150 of the motor drive 134 which was provided to achieve the benchmark air flow rate 148. When the HVAC system 100 is later operated (e.g., to provide heating or cooling), the current flow rate 154 of airflow 118 is determined based on a relationship between the flow rate 154 and the current motor drive frequency 136. FIG. 3 is a plot 300 of curves 306 and 306 illustrating such relationships between the flow rate 154 (y axis) and the current motor drive frequency 136 (x axis). As shown in FIG. 3 and described further below, the relationship between the flow rate 154 and the current motor drive frequency 136 is dependent on the value of the benchmark flow rate 148. Generally, the determined flow rate 154 decreases linearly with a decrease in motor drive frequency 136. Curve 302 illustrates the rate 154 of airflow 118 determined for an initial benchmark flow rate 304 (e.g., a value of benchmark flow rate 148 determined at initial time when the HVAC system 100 is installed). Using the linear relationship illustrated by curve 302, a flow rate 312 is determined at a motor drive frequency 310 and a benchmark flow rate 304.

As described elsewhere herein, after operation of the HVAC system 100 for some period of time, the benchmark values 148, 150 may be updated. For instance, as shown in the example of FIG. 3, an updated benchmark flow rate 308 may be determined at a second time. The updated benchmark flow rate 308 is generally determined when the motor drive 134 is instructed to operate under the same benchmark test conditions (e.g., at the same motor drive frequency 136) as those used to determine the original benchmark flow rate 304. When the HVAC system 100 is operating at these benchmark test conditions, the relationship between determined flow rate 154 and motor drive frequency 136 may be updated. Such an updated relationship is illustrated by curve 306 for updated benchmark flow rate 308. In many cases, the updated benchmark flow rate 308 is less than the previous benchmark flow rate 304 (e.g., because an increase in flow resistance usually occurs over time because of a buildup of material on the air filter 132 of the HVAC system 100). Using the new relationship associated with curve 306, a new flow rate 314 may be determined for the motor drive frequency 310. In this example, the new flow rate 314 is less than the flow rate 312 determined from the initial benchmark flow rate 304 even though the motor drive frequency 310 is the same.

Figure 4:
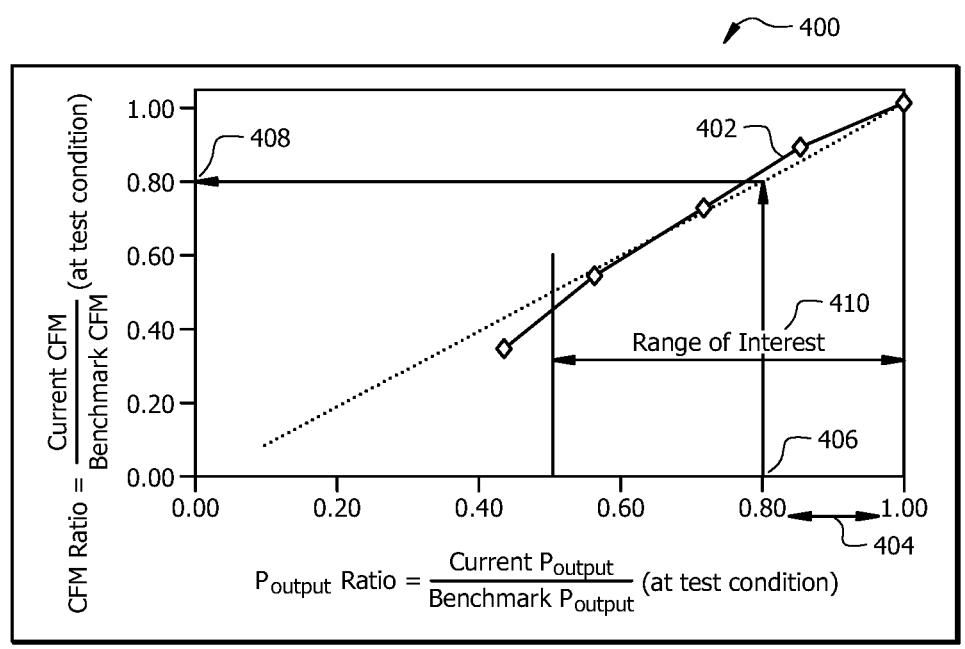
FIG. 4 is a plot of blower air flow rate versus relative power output of the motor drive of the blower.

FIG. 4 illustrates the determination of an updated benchmark flow rate 148 (e.g., the updated benchmark flow rate 308 of FIG. 3 described above). In general, the benchmark flow rate 148 is updated based on a ratio of an updated benchmark power output 150 and a previous benchmark power output 150. Plot 400 of FIG. 4 shows a curve 402 of a flow rate ratio of the current air flow rate 154 to the benchmark flow rate 148 versus a power-output ratio of the current power output 152 to the benchmark power output 150 at the benchmark test conditions (e.g., at a predefined requested output frequency of the motor drive 134). This disclosure encompasses the recognition that the curve 402 plotted in FIG. 4 is approximately linear with a slope of about one and passes through the origin (i.e., passes through the coordinates 0, 0). As such, when operated at the test conditions, a current rate 154 (i.e., for use as an updated benchmark flow rate 148) of the airflow 118 provided by the blower 128 may be determined based on a comparison (e.g., a ratio) of the current power output 152 to the benchmark power output 148 and the previous benchmark flow rate 148, as illustrated in the plot 400 of FIG. 4.

As an example, if after operation of the HVAC system 100 for a period of time, the power-output ratio of the current power output 152 to the benchmark power output 150 decreases by an amount 404 of about 0.2, a power-output ratio 306 of about 0.8 is determined. This example power-output ratio 306 corresponds to a flow rate ratio 308 of about 0.8. For this example case, the updated benchmark flow rate 148 is determined as 0.8×the previous benchmark flow rate 148, and the updated benchmark power output 150 is determined as 0.8×the previous benchmark power output 150. This disclosure further encompasses the recognition that the curve 402 is linear at least for a range of interest 410. In general, if the power-output ratio of the current power output 152 to the benchmark power output 150 decreases below the range of interest 410, an alert 144 may be provided (e.g., rather than updating the benchmark values 148, 150). For instance, if the power output ratio falls below the range of interest 410, the air filter 132 may need to be changed and/or the HVAC system 100 may need maintenance Returning to FIG. 1, the updated benchmark values 148, 150 may be used to update the relationship between the rate of airflow 118 and the power output 152 of the motor drive 134 (see curve 306 of FIG. 3 above). The controller 146 uses the updated benchmark flow rate 148 and benchmark power output 150 to determine air flow rate 154 at subsequent times. If the determined air flow rate 154 falls below a threshold value (e.g., threshold of thresholds 610 of FIG. 6), the controller 146 may cause an alert 144 to be presented on an interface of the thermostat 140 (e.g., to prompt a user to change the air filter 132 and/or to indicate a need for system maintenance).

As described above, in certain embodiments, connections between various components of the HVAC system 100 are wired. For example, conventional cable and contacts may be used to couple the controller 146 to the various components of the HVAC system 100, including, the compressor 106, the expansion valve 114, the motor drive 134, sensor(s) 138a,b, and thermostat(s) 140. In some embodiments, a wireless connection is employed to provide at least some of the connections between components of the HVAC system 100. In some embodiments, a data bus couples various components of the HVAC system 100 together such that data is communicated there between. In a typical embodiment, the data bus may include, for example, any combination of hardware, software embedded in a computer readable medium, or encoded logic incorporated in hardware or otherwise stored (e.g., firmware) to couple components of HVAC system 100 to each other. As an example and not by way of limitation, the data bus may include an Accelerated Graphics Port (AGP) or other graphics bus, a Controller Area Network (CAN) bus, a front-side bus (FSB), a HYPERTRANSPORT (HT) interconnect, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or any other suitable bus or a combination of two or more of these. In various embodiments, the data bus may include any number, type, or configuration of data buses, where appropriate. In certain embodiments, one or more data buses (which may each include an address bus and a data bus) may couple the controller 146 to other components of the HVAC system 100.

In an example operation of HVAC system 100, the HVAC system 100 is installed and setup (e.g., by a technician) to provide conditioned airflow 120 to a space. During the installation and setup, a technician may adjust configurations of various components (e.g., the blower 128) such that a desired rate of airflow 118 is achieved. For example, the technician may adjust the diameter 216 of the driver pulley 208 (see FIG. 2) to achieve a predefined or desired rate of airflow 118 at a predefined motor drive frequency 136 corresponding to benchmark test conditions. Once achieved, this desired rate of airflow 118 may be stored as the benchmark air flow rate ("benchmark CFM") 148 along with a corresponding benchmark output power 150. The benchmark output power 150 generally corresponds to the output power of the motor drive 134 when the benchmark air flow rate 148 was measured at the benchmark test conditions (i.e., at the predefined motor drive frequency 136). In some embodiments, the test conditions correspond to operating the blower 128 (e.g., or instructing the motor drive 134 to drive the blower 128) at a maximum recommended frequency 136. However, the test conditions may more generally correspond to operating the blower 128 (e.g., or instructing the motor drive 134 to drive the blower 128) at any predetermined frequency 136.

After setup of the HVAC system 100, the HVAC system 100 eventually starts up to provide cooling or heating to the space based on temperature setpoint 142. For example, in response to the indoor temperature exceeding the temperature setpoint 142, the controller 146 may cause the compressor 106 and the blower 128 to turn on to startup the HVAC system 100 to provide cooling. During operation of the HVAC system 100, the controller 146 may determine a current flow rate 154 of the airflow 118 provided by the blower 128 based on the current motor drive frequency 136 and the benchmark flow rate 148. For example, the current flow rate 154 may be determined based on a relationship such as is illustrated by curve 302 of FIG. 3. For instance, the flow rate 154 ($CFM_{current}$) may be determined based on:

$$CFM_{current} = CFM^* \frac{v_{current}}{v_{test}}$$

where CFM* is the benchmark flow rate 148, $V_{current}$ is the current motor drive frequency 136, and $v_{test}$ is the motor drive frequency 136 used associated with the benchmark test conditions.

Following operation of the HVAC system 100 for a period of time, the HVAC system 100 may return to operating at the test conditions (i.e., at a predefined value of the motor frequency 136). For example, this predefined motor drive frequency 136 may happen to be requested by the controller 146 based on heating or cooling requirements. In some cases, the controller 146 may determine that greater than a threshold time has passed since the benchmark values 148, 150 have been updated, and, in response to this determination, the controller 146 may cause operation of the motor drive 134 at the predefined motor drive frequency 136 associated with the test conditions. In some cases, the controller 146 may update the benchmark values 148, 150 based on a schedule (e.g., weekly, monthly, semi-annually, annually based on schedule 614 of FIG. 6).

The benchmark flow rate 148 may be updated as described above with respect to FIG. 4. While the motor drive frequency 136 is at the test condition value, the power output 152 may be determined. The ratio of the determined power output 152 to the benchmark power output 150 may be used to determine an updated benchmark flow rate 148, as described above with respect to FIG. 4. For instance, if the current power output 152 is 0.8×the benchmark power output 150, then the updated benchmark flow rate 148 may be set to 0.8×the previous benchmark flow rate 148. In other words, the updated benchmark flow rate 148 ($CFM^*_{new}$) may be determined by:

$$CFM^*_{new} = CFM^* \frac{P_{new}}{P^*}$$

where $P_{new}$ is the current power output 152 and P* is the benchmark power output 150. An updated benchmark power output 150 ($P_{new}$) is also determined for the updated benchmark flow rate 148 ($CFM^*_{new}$).

In some embodiments, the controller 146 may determine that the rate 154 of airflow 118 is less than a threshold value (e.g., a threshold of threshold 610 of FIG. 6) and, following such a determination, the controller 146 may cause an alert 144 to be provided for viewing by a user (e.g., on an interface of the thermostat 140). The alert 144 may prompt a user to change the air filter 132. In some cases, in response to determining that the rate 154 of airflow 118 is less than a threshold value (e.g., a threshold of threshold 610 of FIG. 6), the controller 146 may cause the HVAC system to stop operating to provide cooling or heating (e.g., the controller 146 may stop operation of the compressor 106 and blower 128). This may prevent freezing of a coil of the evaporator 116.

In some cases, the controller 146 may determine that the determined flow rate 154 of airflow 118 is not at a desired value (e.g., a target flow rate of target values 608 of FIG. 6) and adjust the frequency 136 of the motor drive 134 to achieve the desired flow rate. In some embodiments, the measured air flow rate 154 may be used to adjust operation of the blower 128 and/or the compressor 106 to achieve a desired (i.e., predetermined) ratio of the rate of airflow 118 provided by the blower 128 to the tonnage of cooling provided by an HVAC system 100 (the "CFM/ton ratio"). As used herein, the ratio of the rate of airflow 118 provided by the blower 128 to the tonnage of cooling provided by an HVAC system 100 is referred to as the "CFM/ton ratio" of the HVAC system 100. The rate of airflow 118 provided by the blower 128 may be measured in units of cubic feet per minute (CFM). The tonnage of the HVAC system 100 corresponds to the cooling capacity of the system 100, where one "ton" of cooling corresponds to 12000 Btu/hr. The tonnage of the HVAC system 100 is largely determined by the speed of the compressor(s) 106 of the system, such that a decreased compressor speed corresponds to a decreased tonnage. The relationship between compressor speed and system tonnage is approximately linear. Accordingly, the CFM/ton ratio of the HVAC system 100 may be controlled by adjusting the speed of the compressor 106 relative to a determined rate 154 of airflow 118 provided by the blower 128. For example, once a rate 154 of airflow 118 provided by the blower 128 is determined (e.g., using any of the approaches described in this disclosure), the speed of a variable-speed compressor 106 may be decreased, to increase the CFM/ton of the HVAC system 100.

Example Method of Operation

Figure 5:
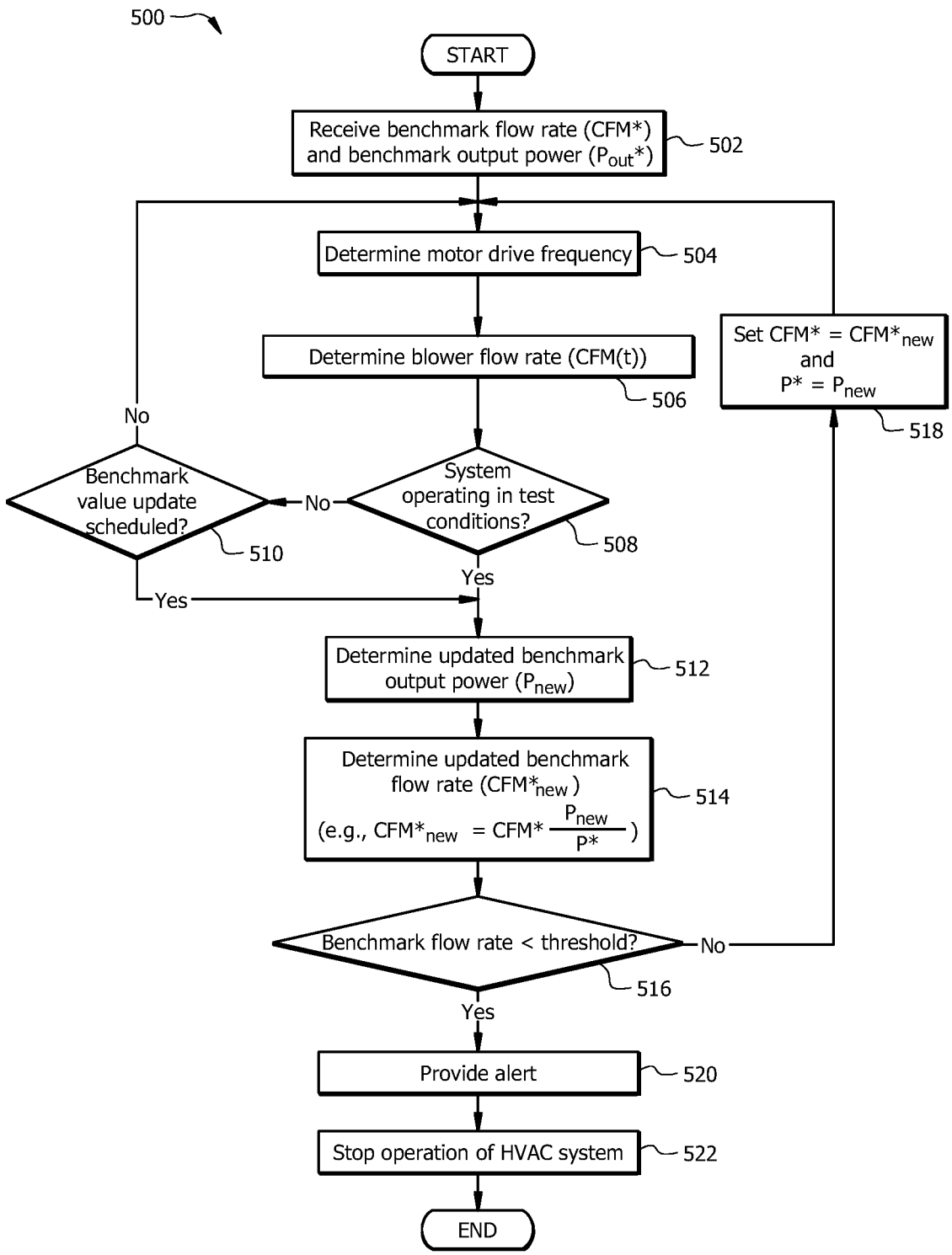
FIG. 5 is a flowchart illustrating an example method of determining a rate of the airflow provided by the blower of the example HVAC system illustrated in FIG. 1.

FIG. 5 is a flowchart illustrating an example method 500 of determining the flow rate 154 of airflow 118 provided by the blower 128 of the HVAC system 100. This information is typically unavailable for many HVAC systems. Knowledge of flow rate 154 is typically not available for HVAC systems with a belt-drive blowers (see FIG. 2) and for systems lacking a dedicated sensor for air flow rate measurement. Method 500 may begin at step 502 where a benchmark rate 148 of airflow 118 and a benchmark power output 150 of the motor drive 134 are received by the controller 146. These benchmark values 148, 150 are determined at test conditions (e.g., by a maintenance technician installing the blower 128 and/or setting up or installing the HVAC system 100). The test conditions generally correspond to operating the motor drive 134 at a predefined value of the motor drive frequency 136. For example, the controller 146 may cause the motor drive 134 to supply electrical power to the motor (e.g., motor 204 of FIG. 2) of the blower 128 at a predefined motor drive frequency 136 in order to operate at the test condition(s). The motor drive frequency 136 may be referred to as a "speed" of the motor drive and may be a value with units of hertz (Hz).

At step 504, the controller 146 determines a current motor drive frequency 136 at which the motor drive 134 is operated. For example, the instructions 210 provided to the motor 204 of the blower 128 may include the current motor drive frequency 136 (see FIG. 2). At step 506, the controller 146 determines the rate 154 of airflow 118 provided by the blower 128. For example, as described above, the controller 146 may determine the current flow rate 154 of the airflow 118 provided by the blower 128 based on the current motor drive frequency 136 and the benchmark flow rate 148. For example, the current flow rate 154 may be determined based on a relationship such as described by curve 302 of FIG. 3 described above. For instance, the flow rate 154 ($CFM_{current}$) may be determined based on:

$$CFM_{current} = CFM^* \frac{v_{current}}{v_{test}}$$

where CFM* is the benchmark flow rate 148, $V_{current}$ is the current motor drive frequency 136, and $v_{test}$ is the motor drive frequency 136 used for the benchmark test.

Once the current flow rate 154 of airflow 118 is determined the controller 146 may adjust operation of the motor drive 134 and/or other components of the HVAC system 100 to achieve desired operating parameters (e.g., a desired rate 154 of airflow 118 and/or a desired CFM/ton ratio), as described above. For example, the controller 146 may determine that the determined flow rate 154 of airflow 118 is not at a desired value (e.g., a target flow rate of target values 608 of FIG. 6) and adjust the motor drive frequency 136 to achieve the desired flow rate. In some embodiments, the measured rate 154 of airflow 118 may be used to adjust operation of the blower 128 and/or the compressor 106 to achieve a desired (i.e., predetermined) CFM/ton ratio (e.g., a target CFM/ton ratio of target values 608 of FIG. 6), as described above.

At step 508, the controller 146 determines whether the current operating conditions of the HVAC system 100 are appropriate for updating the benchmark values 148, 150. For example, at step 508, the controller 146 may determine whether the current motor drive frequency 136 corresponds to a predefined motor drive frequency 136 associated with the test conditions at which the original benchmark values 148, 150 were determined (see step 502). For example, the predefined motor drive frequency 136 associated with the test conditions may happen to be requested by the controller 146 based on heating or cooling needs. If at step 508, the controller 146 determines that the HVAC system 100 is not operating at the test conditions, the controller 146 proceeds to step 510 and determines whether an update to the benchmark values 148, 150 is scheduled. For instance, in some cases, the controller 146 may determine that greater than a threshold time has passed since the benchmark values 148, 150 were last updated, and, in response to this determination, the controller 146 may determine that an update is scheduled. In some cases, the controller 146 may determine that an update is scheduled based on a predefined schedule (e.g., schedule 614 of FIG. 6). If an update is scheduled at step 510, the controller 146 causes operation of the motor drive 134 at the test condition(s) (i.e., at the predefined value of motor drive frequency 136) and proceeds to step 512.

With the HVAC system 100 operating at the test condition(s), following steps 508 and 510, the controller 146 determines a current power output 152 at step 512. For example, the controller 146 may determine the amount of power supplied by the motor drive 134. At step 514, the controller 146 determines an updated benchmark rate 148 of airflow 118 using the current power output 152 achieved at the test condition(s). For example, the ratio of the current power output 152 to the benchmark power output 150 may be used to determine an updated benchmark flow rate 148 (see FIG. 4). For instance, if the current power output 152 is 0.8×the benchmark power output 150, then the updated benchmark flow rate 148 may be set to 0.8×the previous benchmark flow rate 148. In other words, the updated benchmark flow rate 148 ($CFM^*_{new}$) may be determined by:

$$CFM^*_{new} = CFM^* \frac{P_{new}}{P^*}$$

where $P_{new}$ is the current power output 152 and P* is the benchmark power output 150.

Figure 6:
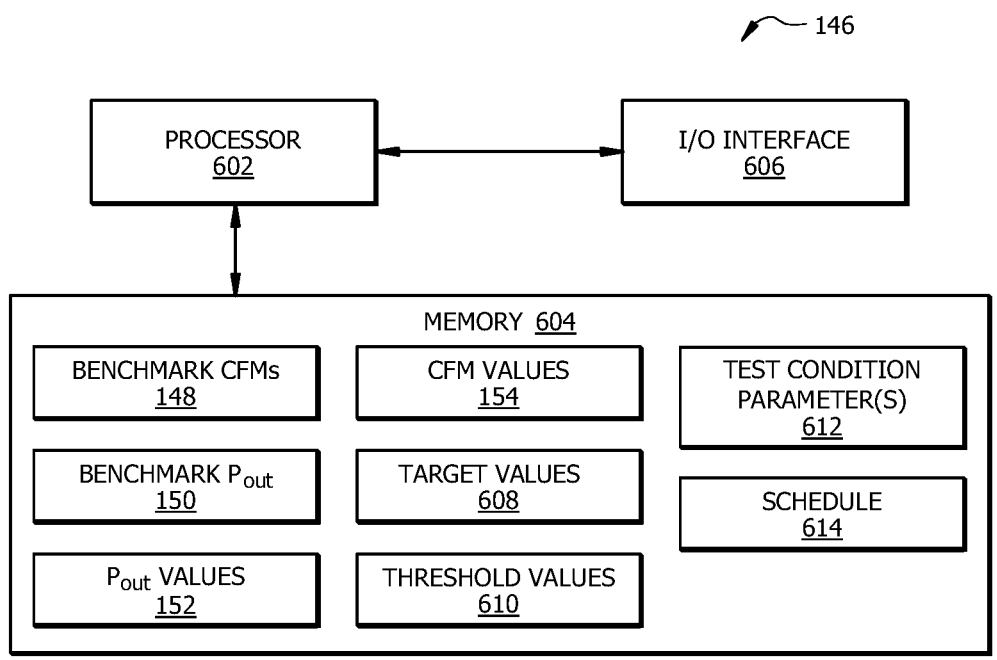
FIG. 6 is a diagram of the controller of the example HVAC system illustrated in FIG. 1.

At step 516, the controller 146 determines whether benchmark flow rate 148 determined at step 514 is less than a threshold value (e.g., a threshold of thresholds 610 of FIG. 6). If the benchmark flow rate 148 determined at step 514 is not less than the threshold value, the controller 146 may proceed to step 518 where the benchmark values 148, 150 are set as the updated values 148, 150 and the process 500 may return to step 504. However, if the benchmark flow rate 148 determined at step 514 is less than the threshold value, the controller 146 may proceed to step 520 where an alert 144 is provided for viewing by a user (e.g., on an interface of the thermostat 140). The alert 144 may prompt a user to change the air filter 132. In some embodiments, at step 522, the controller 146 may cause the HVAC system to stop operating to provide cooling or heating (e.g., the controller 146 may stop operation of the compressor 106 and/or blower 128). In some embodiments, the controller 146 may determine that a measured rate 154 of the airflow 118 provided by the blower 128 is less than a threshold value (e.g., a threshold of thresholds 610 of FIG. 6). If this is the case, the controller 146 may proceed to step 520, as described above.

Modifications, additions, or omissions may be made to method 500 depicted in FIG. 5. Method 500 may include more, fewer, or other steps. For example, steps may be performed in parallel or in any suitable order. While at times discussed as controller 146, HVAC system 100, or components thereof performing the steps, any suitable HVAC system or components thereof may perform one or more steps of the method 500.

Example Controller

FIG. 6 is a schematic diagram of an embodiment of the controller 146. The controller 146 includes a processor 602, a memory 604, and an input/output (I/O) interface 606.

The processor 602 includes one or more processors operably coupled to the memory 604. The processor 602 is any electronic circuitry including, but not limited to, state machines, one or more central processing unit (CPU) chips, logic units, cores (e.g. a multi-core processor), field-programmable gate array (FPGAs), application specific integrated circuits (ASICs), or digital signal processors (DSPs) that communicatively couples to memory 604 and controls the operation of HVAC system 100. The processor 602 may be a programmable logic device, a microcontroller, a microprocessor, or any suitable combination of the preceding. The processor 602 is communicatively coupled to and in signal communication with the memory 604. The one or more processors are configured to process data and may be implemented in hardware or software. For example, the processor 602 may be 8-bit, 16-bit, 32-bit, 64-bit or of any other suitable architecture. The processor 602 may include an arithmetic logic unit (ALU) for performing arithmetic and logic operations, processor registers that supply operands to the ALU and store the results of ALU operations, and a control unit that fetches instructions from memory 604 and executes them by directing the coordinated operations of the ALU, registers, and other components. The processor 602 may include other hardware and software that operates to process information, control the HVAC system 100, and perform any of the functions described herein (e.g., with respect to FIG. 3). The processor 602 is not limited to a single processing device and may encompass multiple processing devices. Similarly, the controller 146 is not limited to a single controller but may encompass multiple controllers.

The memory 604 includes one or more disks, tape drives, or solid-state drives, and may be used as an over-flow data storage device, to store programs when such programs are selected for execution, and to store instructions and data that are read during program execution. The memory 604 may be volatile or non-volatile and may include ROM, RAM, ternary content-addressable memory (TCAM), dynamic random-access memory (DRAM), and static random-access memory (SRAM). The memory 604 is operable to store benchmark flow rates 148 benchmark power outputs 150, current power outputs 152, determined flow rates 154, target values 608 (i.e., target values of flow rate 154 and/or CFM/ton ratio), thresholds 510 (e.g., any of the threshold values described in this disclosure, test condition parameters 612 (e.g., the predefined value of motor drive frequency 136 used during determination of benchmark values 148, 150), schedule 614, and/or any other logic and/or instructions for performing the function described in this disclosure.

The I/O interface 606 is configured to communicate data and signals with other devices. For example, the I/O interface 606 may be configured to communicate electrical signals with components of the HVAC system 100 including the compressor 106, expansion valve 114, blower 128, sensors 138a,b, motor drive 134, and thermostat 140. The I/O interface may provide and/or receive, for example, compressor speed signals blower speed signals, temperature signals, relative humidity signals, thermostat calls, temperature setpoints, environmental conditions, and an operating mode status for the HVAC system 100 and send electrical signals to the components of the HVAC system 100. The I/O interface 606 may include ports or terminals for establishing signal communications between the controller 146 and other devices. The I/O interface 606 may be configured to enable wired and/or wireless communications.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

What is claimed is:

1. A heating, ventilation and air conditioning (HVAC) system, comprising:
   a blower comprising:
   a pulley configured, when rotated, to cause a flow of air to be provided through at least one duct of the HVAC system; and a motor configured, when supplied electrical power, to cause the pulley to rotate;

a motor drive configured to supply the electrical power to the motor of the blower;

a controller communicatively coupled to the motor drive, the controller configured to:

receive a benchmark rate of the flow of air provided by the blower and a corresponding benchmark power output of the motor drive associated with operation of the blower at a test condition, wherein the test condition corresponds to operating the blower at a predefined motor drive frequency;

following operation of HVAC system for an initial period of time:

determine a current power output of the motor drive during operation of the blower at the test condition, wherein the current power output is different than the benchmark power output;

determine, based on the benchmark rate of the flow of air provided by the blower and a comparison of a current benchmark power output to the benchmark power output, an updated benchmark rate of the flow of air provided by the blower;

determine that the motor drive is operating at a particular motor drive frequency; and determine, based on the updated benchmark rate of the flow of air provided by the blower and a comparison of the particular motor drive frequency to the predefined motor drive frequency, a particular rate of the flow of air provided by the blower.

2. The system of claim 1, the controller further configured to cause the blower to operate at the test condition by causing the motor drive to supply power to the motor of the blower at the predefined motor drive frequency.

3. The system of claim 1, wherein the controller is further configured to determine the updated benchmark rate of the flow of air provided by the blower by:

determining a first ratio of the current benchmark power output to the benchmark power output; and multiplying the first ratio by the benchmark rate of the flow of air provided by the blower; and determine the particular rate of the flow of air provided by the blower by:

determining a second ratio of the particular motor drive frequency to the predefined motor drive frequency associated with the test condition; and multiplying the second ratio by the updated benchmark rate of the flow of air provided by the blower.

4. The system of claim 1, the controller further configured to:

determine a second power output of the motor drive during operation of the blower at the test condition;

determine, based on the updated benchmark rate of the flow of air provided by the blower and a comparison of the second power output and the updated benchmark power output, a second updated benchmark rate of the flow of air provided by the blower;

determine that the second updated benchmark rate of the flow of air is less than a threshold value; and in response to determining that the second updated benchmark rate of the flow of air is less than the threshold value, provide an alert indicating inadequate airflow in the HVAC system.

5. The system of claim 4, the controller further configured, in response to determining that the second updated benchmark rate of the flow of air is less than the threshold value, to automatically cause the HVAC system to stop providing heating or cooling.

6. The system of claim 1, further comprising:

a compressor configured to compress a refrigerant flowing through the HVAC system; and the controller communicatively coupled to the compressor and further configured to:

determine, based on the particular rate of the flow of air provided by the blower and a speed of the compressor, a ratio of air flow rate to tonnage of cooling (CFM/ton ratio) for the HVAC system;

determine that the CFM/ton ratio is different than a predefined target ratio; and in response to determining that that the CFM/ton ratio is different than the target ratio, adjust the speed of the compressor to obtain the target ratio.

7. The system of claim 1, the controller further configured to:

determine that the particular rate of the flow of air provided by the blower is less than a target value; and in response to determining that the particular rate of the flow of air provided by the blower is less than the target value, cause the motor drive to supply an increased amount of the electrical power to the motor of the blower.

8. A method comprising, by a controller of a heating, ventilation and air conditioning (HVAC) system:

receiving a benchmark rate of the flow of air provided by a blower of the HVAC system and a corresponding benchmark power output of a motor drive associated with operation of the blower at a test condition, wherein the test condition corresponds to operating the blower at a predefined motor drive frequency;

following operation of HVAC system for an initial period of time:

determining a current power output of the motor drive during operation of the blower at the test condition, wherein the current power output is different than the benchmark power output;

determining, based on the benchmark rate of the flow of air provided by the blower and a comparison of a current benchmark power output to the benchmark power output, an updated benchmark rate of the flow of air provided by the blower;

determining that the motor drive is operating at a particular motor drive frequency; and determining, based on the updated benchmark rate of the flow of air provided by the blower and a comparison of the particular motor drive frequency to the predefined motor drive frequency, a particular rate of the flow of air provided by the blower.

9. The method of claim 8, further comprising causing the blower to operate at the test condition by causing the motor drive to supply power to the motor of the blower at the predefined motor drive frequency.

10. The method of claim 8, further comprising determining the updated benchmark rate of the flow of air provided by the blower by:

determining a first ratio of the current benchmark power output to the benchmark power output; and multiplying the first ratio by the benchmark rate of the flow of air provided by the blower; and determining the particular rate of the flow of air provided by the blower by:
  determining a second ratio of the particular motor drive frequency to the predefined motor drive frequency associated with the test condition; and
  multiplying the second ratio by the updated benchmark rate of the flow of air provided by the blower.

11. The method of claim 8, further comprising:
  determining a second power output of the motor drive during operation of the blower at the test condition;
  determining, based on the updated benchmark rate of the flow of air provided by the blower and a comparison of the second power output and the updated benchmark power output, a second updated benchmark rate of the flow of air provided by the blower;
  determining that the second updated benchmark rate of the flow of air is less than a threshold value; and
  in response to determining that the second updated benchmark rate of the flow of air is less than the threshold value, providing an alert indicating inadequate airflow in the HVAC system.

12. The method of claim 11, further comprising, in response to determining that the second updated benchmark rate of the flow of air is less than the threshold value, to automatically cause the HVAC system to stop providing heating or cooling.

13. The method of claim 8, further comprising:
  determining, based on the particular rate of the flow of air provided by the blower and a speed of a compressor of the HVAC system, a ratio of air flow rate to tonnage of cooling (CFM/ton ratio) for the HVAC system;
  determining that the CFM/ton ratio is different than a predefined target ratio; and
  in response to determining that that the CFM/ton ratio is different than the target ratio, adjusting the speed of the compressor to obtain the target ratio.

14. The method of claim 8, further comprising:
  determining that the particular rate of the flow of air provided by the blower is less than a target value; and
  in response to determining that the particular rate of the flow of air provided by the blower is less than the target value, causing the motor drive to supply an increased amount of the electrical power to the motor of the blower.

15. A controller for operating a blower of a heating, ventilation, and air conditioning (HVAC) system, the controller comprising:
  an input/output interface configured to:
    receive a benchmark rate of the flow of air provided by the blower and a corresponding benchmark power output of the motor drive associated with operation of the blower at a test condition, wherein the test condition corresponds to operating the blower at a predefined motor drive frequency; and
  a processor coupled to the input/output interface and configured to:
    following operation of HVAC system for an initial period of time:
      determine a current power output of the motor drive during operation of the blower at the test condition, wherein the current power output is different than the benchmark power output;
      determine, based on the benchmark rate of the flow of air provided by the blower and a comparison of a current benchmark power output to the benchmark power output, an updated benchmark rate of the flow of air provided by the blower;
      determine that the motor drive is operating at a particular motor drive frequency; and
      determine, based on the updated benchmark rate of the flow of air provided by the blower and a comparison of the particular motor drive frequency to the predefined motor drive frequency, a particular rate of the flow of air provided by the blower.

16. The controller of claim 15, the processor further configured to cause the blower to operate at the test condition by causing the motor drive to supply power to the motor of the blower at the predefined motor drive frequency.

17. The controller of claim 15, wherein the processor is further configured to determine the updated benchmark rate of the flow of air provided by the blower by:
  determining a first ratio of the current benchmark power output to the benchmark power output; and
  multiplying the first ratio by the benchmark rate of the flow of air provided by the blower; and
  determine the particular rate of the flow of air provided by the blower by:
  determining a second ratio of the particular motor drive frequency to the predefined motor drive frequency associated with the test condition; and
  multiplying the second ratio by the updated benchmark rate of the flow of air provided by the blower.

18. The controller of claim 15, the processor further configured to:
  determine a second power output of the motor drive during operation of the blower at the test condition;
  determine, based on the updated benchmark rate of the flow of air provided by the blower and a comparison of the second power output and the updated benchmark power output, a second updated benchmark rate of the flow of air provided by the blower;
  determine that the second updated benchmark rate of the flow of air is less than a threshold value; and
  in response to determining that the second updated benchmark rate of the flow of air is less than the threshold value, provide an alert indicating inadequate airflow in the HVAC system.

19. The controller of claim 15, the processor further configured, in response to determining that the second updated benchmark rate of the flow of air is less than the threshold value, to automatically cause the HVAC system to stop providing heating or cooling.

20. The controller of claim 15, the processor further configured to:
  determine, based on the particular rate of the flow of air provided by the blower and a speed of a compressor of the HVAC system, a ratio of air flow rate to tonnage of cooling (CFM/ton ratio) for the HVAC system;
  determine that the CFM/ton ratio is different than a predefined target ratio; and
  in response to determining that that the CFM/ton ratio is different than the target ratio, adjust the speed of the compressor to obtain the target ratio.

* * * * *